(12) United States Patent
Lu et al.

(10) Patent No.: US 9,468,120 B2
(45) Date of Patent: Oct. 11, 2016

(54) HOUSING, BOBBIN, AND ELECTRONIC DEVICE

(71) Applicant: DELTA ELECTRONICS (SHANGHAI) CO., LTD., Shanghai (CN)

(72) Inventors: Xing-Xian Lu, Shanghai (CN); Pei-Ai You, Shanghai (CN); Gang Liu, Shanghai (CN); Jin-Fa Zhang, Shanghai (CN)

(73) Assignee: DELTA ELECTRONICS (SHANGHAI) CO., LTD. (CN)

( * ) Notice: Subject to any disclaimer, the term of this patent is extended or adjusted under 35 U.S.C. 154(b) by 48 days.

(21) Appl. No.: 14/549,083

(22) Filed: Nov. 20, 2014

(65) Prior Publication Data

US 2015/0146402 A1 May 28, 2015

(30) Foreign Application Priority Data

Nov. 26, 2013 (CN) .......................... 2013 1 0613222

(51) Int. Cl.
| | |
|---|---|
| *H05K 7/02* | (2006.01) |
| *H05K 7/04* | (2006.01) |
| *H05K 7/14* | (2006.01) |
| *H01R 4/34* | (2006.01) |
| *H01F 27/29* | (2006.01) |
| *H01F 27/32* | (2006.01) |
| *H01R 11/12* | (2006.01) |
| *H01F 27/06* | (2006.01) |

(52) U.S. Cl.
CPC ................ *H05K 7/02* (2013.01); *H01F 27/06* (2013.01); *H01F 27/29* (2013.01); *H01R 4/34* (2013.01); *H05K 7/1432* (2013.01); *H01F 27/325* (2013.01); *H01F 2027/065* (2013.01); *H01R 11/12* (2013.01)

(58) Field of Classification Search
USPC ....... 361/728–730, 752, 796, 807, 809, 810; 439/801, 883, 860, 733.1
See application file for complete search history.

(56) References Cited

U.S. PATENT DOCUMENTS

| | | | | |
|---|---|---|---|---|
| 4,361,371 | A | * | 11/1982 | Williams ............. H01R 9/2425 361/752 |
| 5,741,161 | A | | 4/1998 | Cahaly et al. |
| 5,808,861 | A | | 9/1998 | Nakajima et al. |

(Continued)

FOREIGN PATENT DOCUMENTS

| | | |
|---|---|---|
| CN | 102196703 | 9/2011 |
| EP | 1603196 | 12/2005 |

(Continued)

*Primary Examiner* — Hung S Bui
(74) *Attorney, Agent, or Firm* — Hauptman Ham, LLP (57) ABSTRACT

A housing covering an electronic component is provided. The housing includes a body, a first coupling portion, and a third coupling portion. The body has a first surface and a second surface connected to the first surface, and a normal direction of the first surface and a normal direction of the second surface are interlaced with each other. The first coupling portion is disposed on the first surface and detachably coupled with a second coupling portion of a terminal of the electronic component, such that degrees of freedom in a first direction and a second direction of the terminal are restricted. The third coupling portion is disposed on the second surface and detachably coupled with a fourth coupling portion of the terminal, such that a degree of freedom in a third direction of the terminal is restricted. The first direction, the second direction, and the third direction are linearly independent.

21 Claims, 8 Drawing Sheets

(56) References Cited

U.S. PATENT DOCUMENTS

| | | | | |
|---|---|---|---|---|
| 5,997,341 | A * | 12/1999 | Ushiyama | H01R 4/305 439/480 |
| 6,053,780 | A * | 4/2000 | Ono | H01R 4/34 439/810 |
| 6,824,432 | B2 * | 11/2004 | Katsuzawa | H02K 5/225 439/709 |
| 7,442,090 | B2 * | 10/2008 | Mori | H01R 25/003 174/53 |
| 7,559,810 | B1 * | 7/2009 | Wu | H01R 4/34 439/709 |
| 9,093,761 | B1 * | 7/2015 | Wu | H01R 4/42 |
| 2012/0139684 | A1 | 6/2012 | Kobayashi et al. | |
| 2015/0145469 | A1 * | 5/2015 | You | H02J 7/0042 320/107 |
| 2015/0146377 | A1 * | 5/2015 | You | H05K 7/1432 361/707 |
| 2015/0146378 | A1 * | 5/2015 | You | H05K 7/20254 361/707 |

FOREIGN PATENT DOCUMENTS

| | | |
|---|---|---|
| EP | 1713097 | 10/2006 |
| FR | 2736199 | 1/1997 |
| JP | 57-007179 | 1/1982 |
| JP | 61-142718 | 6/1986 |
| JP | 62-101211 | 6/1987 |
| JP | 6-026141 | 4/1994 |
| JP | 08-250168 | 9/1996 |
| JP | 2000-091143 | 3/2000 |
| JP | 2006-260958 | 9/2006 |
| JP | 2008-172053 | 7/2008 |
| JP | 2010-027410 | 2/2010 |
| JP | 2012-049269 | 3/2012 |
| JP | 2012-119415 | 6/2012 |
| JP | 2012-119545 | 6/2012 |
| JP | 2013-145850 | 7/2013 |
| JP | 2013-175565 | 9/2013 |
| JP | 2013-179184 | 9/2013 |
| TW | 389406 | 5/2000 |
| TW | M408784 | 8/2011 |
| TW | M428555 | 5/2012 |

* cited by examiner

HOUSING, BOBBIN, AND ELECTRONIC DEVICE

RELATED APPLICATIONS

This application claims priority to Chinese Application Serial Number 201310613222.6, filed Nov. 26, 2013, which is herein incorporated by reference.

BACKGROUND

In recent years, the electric vehicles have achieved great improvements in the core technologies and have been gradually entering the stage of practical use and small scale industrialization.

As one of the key components of electric vehicle, the OBCM (on board charge module) is an electronic device mounted on board for charging battery packs. The OBCM uses input wires to receive alternative current from the AC power grid, and outputs high voltage direct current to charge the on board high voltage battery pack, and uses a communication port to maintain real-time interactive communications with a battery management system (BMS). Due to the severe on board operation conditions, the structure and packaging design and as well as the thermal management are the key challenges for OBCM design.

SUMMARY

This disclosure provides an electronic device, a housing, and a bobbin. A printed circuit board therein is connected to an electronic component by the coupling of a screw and a nut, and the terminal connected to the electronic component may be stably fixed, such that the connection reliability is improved.

In one embodiment, a housing is provided. The housing at least partially covers an electronic component. The housing includes a body, at least one first coupling portion, and at least one third coupling portion. The body has a first surface and a second surface connected to the first surface, and a normal direction of the first surface and a normal direction of the second surface are interlaced with each other. The first coupling portion is disposed on the first surface, configured for being detachably coupled with at least one second coupling portion of at least one terminal of the electronic component, such that degrees of freedom in a first direction and a second direction of the terminal are restricted. The third coupling portion is disposed on the second surface, configured for being detachably coupled with at least one fourth coupling portion of the terminal, such that a degree of freedom in a third direction of the terminal is restricted. The first direction, the second direction, and the third direction are linearly independent.

In another embodiment, a bobbin is provided. The bobbin holds at least one coil. The bobbin includes a body, at least one first coupling portion, and at least one third coupling portion. The body has a first surface and a second surface connected to the first surface, and a normal direction of the first surface and a normal direction of the second surface are interlaced with each other. The first coupling portion is disposed on the first surface, configured for being detachably coupled with at least one second coupling portion of at least one terminal electrically connected to the coil, such that degrees of freedom in a first direction and a second direction of the terminal are restricted. The third coupling portion is disposed on the second surface, configured for being detachably coupled with at least one fourth coupling portion of the terminal, such that a degree of freedom in a third direction of the terminal is restricted. The first direction, the second direction, and the third direction are linearly independent.

In another embodiment, an electronic device is provided. The electronic device includes at least one electronic component, a connected member, at least one terminal, and at least one fixing member. The terminal is electrically connected to the electronic component and the connected member. The terminal includes a body, at least one first coupling portion, and at least one second coupling portion. The first coupling portion is disposed on the body of the terminal. The second coupling portion is disposed on the body of the terminal. The fixing member is connected to the electronic component. The fixing member includes a body, at least one third coupling portion, and at least one fourth coupling portion. The body has a first surface and a second surface connected to the first surface, and a normal direction of the first surface and a normal direction of the second surface are interlaced with each other. The third coupling portion is disposed on the first surface, configured for being detachably coupled with the first coupling portion, such that degrees of freedom in a first direction and a second direction of the terminal are restricted. The fourth coupling portion is disposed on the second surface, configured for being detachably coupled with the second coupling portion, such that a degree of freedom in a third direction of the terminal is restricted. The first direction, the second direction, and the third direction are linearly independent.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
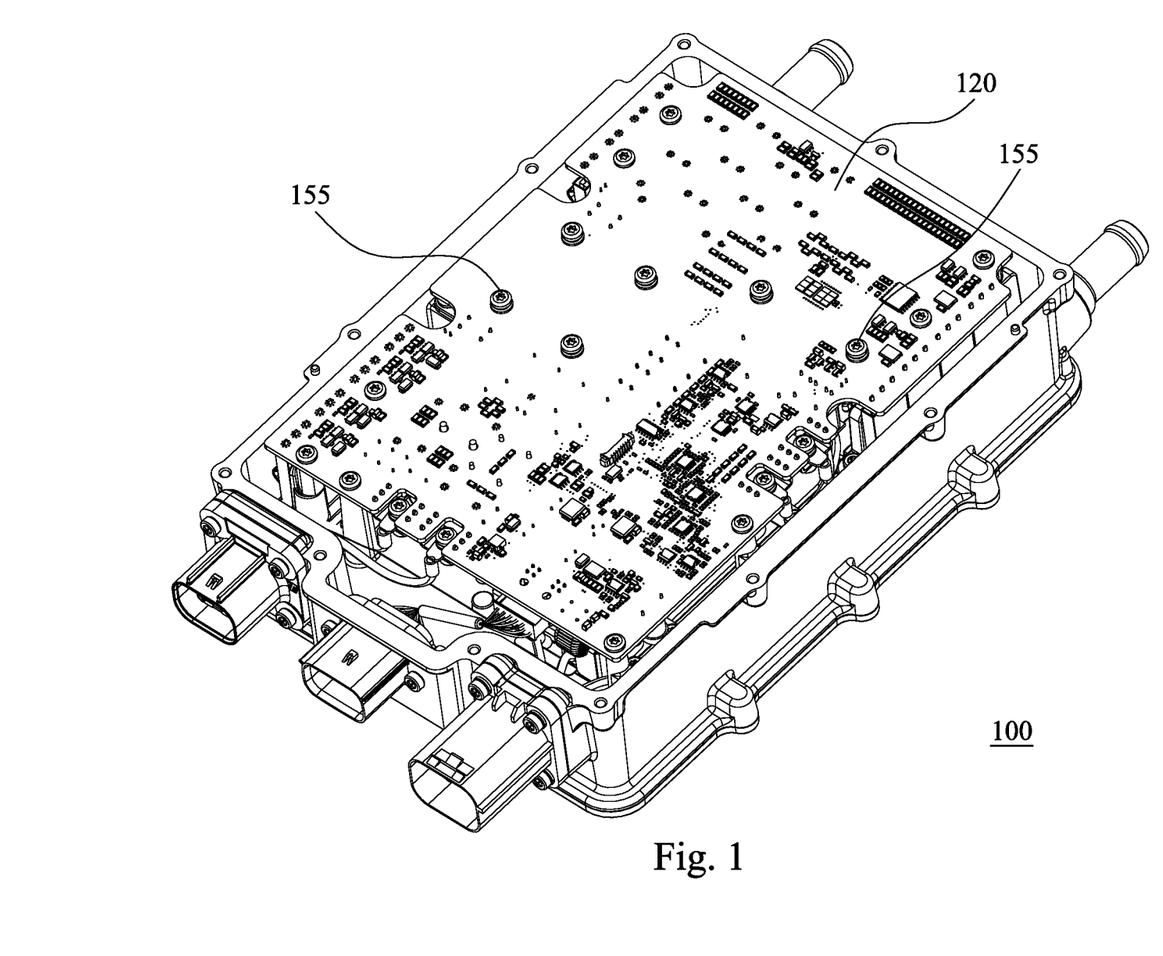
FIG. 1 is a perspective view of an electronic device according to one embodiment of this invention.
Figure 2:
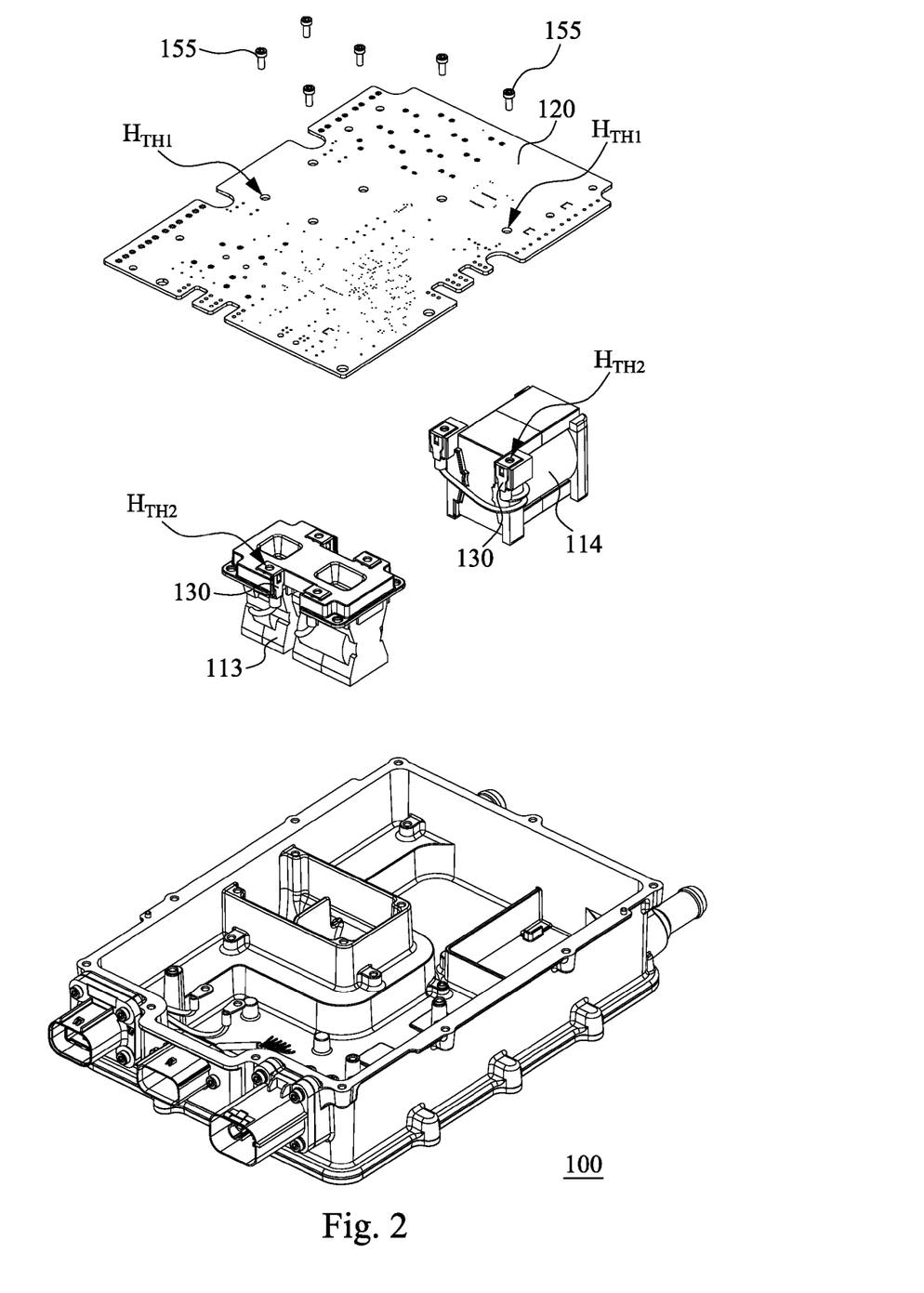
FIG. 2 is an exploded view of the electronic device of FIG. 1.
Figure 3:
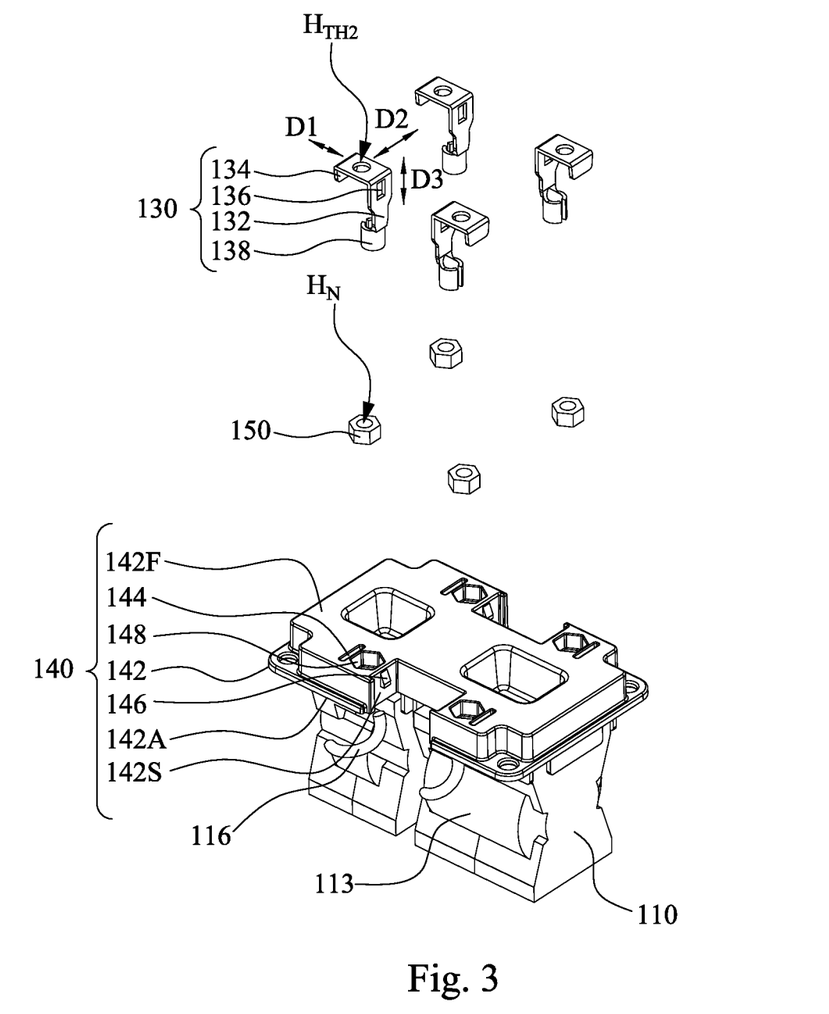
FIG. 3 is an exploded view of a fixing member and a terminal of FIG. 2.

FIG. 1 is a perspective view of an electronic device 100 according to one embodiment of this invention. FIG. 2 is an exploded view of the electronic device 100 of FIG. 1. FIG. 3 is an exploded view of a fixing member 140 and a terminal 130 of FIG. 2. As shown in FIG. 1 to FIG. 3, an electronic device 100 is provided. The electronic device 100 includes at least one electronic component 110, a connected member 120, at least one terminal 130, and at least one fixing member 140. The terminal 130 is electrically connected to the electronic component 110 and the connected member 120. The terminal 130 includes a body 132, a coupling portion 134, and a coupling portion 136. The coupling portions 134 and 136 are disposed on the body 132 of the terminal 130. The fixing member 140 is connected to the electronic component 110. The fixing member 140 includes a body 142, a coupling portion 144, and a coupling portion 146. The body 142 of the fixing member 140 has a first surface 142F and a second surface 142S connected to the first surface 142F, and a normal direction of the first surface 142F and a normal direction of the second surface 142S are interlaced with each other. The coupling portion 144 is disposed on the first surface 142F, for being detachably coupled with the coupling portion 134, such that degrees of freedom in a first direction D1 and a second direction D2 of the terminal 130 are restricted. The coupling portion 146 is disposed on the second surface 142S, for being detachably coupled with the coupling portion 136, such that a degree of freedom in a third direction D3 of the terminal 130 is restricted. The first direction D1, the second direction D2, and the third direction D3 are linearly independent. The terminal 130 includes a connecting end 138, and the connecting end 138 is electrically connected to a connecting wire 116 which extends from the electronic component 110.

As shown in FIG. 2 and FIG. 3, the body 142 of the fixing member 140 has a notch 148 therein. A nut 150 which has a tapped hole $H_N$ therein is accommodated in the notch 148. The connected member 120 has a through hole $H_{TH1}$ therein. The body 132 of the terminal 130 has a through hole $H_{TH2}$ therein. In the assembling process, a screw 155 passes the through hole $H_{TH1}$ of the connected member 120 and then the through hole $H_{TH2}$ of the body 132 of the terminal 130 and then coupled with the nut 150. Specifically, in the embodiment, when the nut 150 is accommodated in the notch 148, the coupling portion 134 is coupled with the coupling portion 144, and the coupling portion 136 is coupled with the coupling portion 146, the tapped hole $H_N$ of the nut 150 is connected to the through hole $H_{TH2}$ of the body 132 of the terminal 130, such that the screw 155 may pass the through hole $H_{TH1}$ of the connected member 120 and the through hole $H_{TH2}$ of the body 132 of the terminal 130 and be coupled with the nut 150.

More specifically, as shown in FIG. 3, the fixing member 140 is a housing, and the housing at least partially covers the electronic component 110. People having ordinary skill in the art can make proper modification to the fixing member 140 according to their actual needs.

As shown in FIG. 3, the coupling portion 134 may be a protruded coupling portion, and the coupling portion 144 may be a recessed coupling portion. With the shape matching, the coupling portion 134 may be detachably coupled with the coupling portion 144. By restricting the degrees of freedom in the first direction D1 and the second direction D2 of the coupling portion 134, the degrees of freedoms in the first direction D1 and the second direction D2 of the terminal 130 is restricted as well. People having ordinary skill in the art can make proper modification to the shape according to their actual needs. In other embodiments, the coupling portion 134 may be a recessed coupling portion, and the coupling portion 144 may be a protruded coupling portion. The key point is that the degrees of freedoms in the first direction D1 and the second direction D2 of the terminal 130 can be restricted.

As shown in FIG. 3, the coupling portion 136 may be a recessed coupling portion, and the coupling portion 146 may be a protruded coupling portion. Similarly, with the shape matching, the coupling portion 136 may be detachably coupled with the coupling portion 146. By restricting the degree of freedom in the third direction D3 of the coupling portion 136, the degree of freedom in the third direction D3 of the terminal 130 is restricted as well. People having ordinary skill in the art can make proper modification to the shape according to their actual needs. In other embodiments, the coupling portion 136 may be a protruded coupling portion, and the coupling portion 146 may be a recessed coupling portion. The key point is that the degree of freedom in the third direction D3 of the terminal 130 can be restricted.

Because the first direction D1, the second direction D2, and the third direction D3 are linearly independent, when the degrees of freedom in the first direction D1, the second direction D2, and the third direction D3 are all restricted, the terminal 130 is stably fixed. The terminal 130 includes the connecting end 138, the connecting wire 116 extends from the electronic component 110, and the connecting end 138 is electrically connected to the connecting wire 116, such that the electronic component 110 is electrically connected to the terminal 130. The connecting end 138 may be connected to the connecting wire 116 by riveting or welding, and the connecting wire 116 may be a single-strand or multi-strand wire. Specifically, when the electronic component 110 is an electromagnetic induction module, the connecting wire 116 may be a wire extending from a coil. As shown in FIG. 2 and FIG. 3, in the embodiment, four terminals 130 are coupled with the body 142 of the fixing member 140 (the housing).

In the embodiment, the connected member 120 is a printed circuit board. Correspondingly, as shown in FIG. 2, a plurality of through holes $H_{TH1}$ are disposed on the printed circuit board (the connected member 120), and the position of the through holes $H_{TH1}$ correspond to the through holes $H_{TH2}$ of the body 132 of the terminal 130. When the coupling portion 134 is coupled with the coupling portion 144 and the coupling portion 136 is coupled with the coupling portion 146, as shown in FIG. 3, the tapped hole $H_N$ of the nut 150 is connected to the through hole $H_{TH2}$ of the body 132 of the terminal 130. At that time, the assembly worker may use the screws 155 to fix the printed circuit board (the connected member 120) to the body 132 of the terminal 130. The assembly worker first passes the screw 155 through the through hole $H_{TH1}$ in the printed circuit board (the connected member 120) and then pass the screw 155 through the through hole $H_{TH2}$ of the body 132 of the terminal 130. Then, the assembly work couples the screw 155 with the nut 150. As shown in FIG. 3, because the shape of the notch 148 matches the nut 150, the nut 150 cannot rotate in the notch 148. Therefore, when the screw 155 is being coupled with the nut 150, the screw 155 may rotate with respect to the nut 150, such that the coupling of the screw 155 and the nut 150 may be performed successfully. The notch 148 may be a hexagonal column or a polygonal column.

As mentioned above, when the screw 155 is coupled with the nut 150, the printed circuit board (the connected member 120) is fixed to the body 132 of the terminal 130. The printed circuit board (the connected member 120) has a connecting portion, and the through hole $H_{TH1}$ is disposed in the connecting portion. The connecting portion is electrically connected to at least one electronic component 110 (the connected member 120) on the printed circuit board. The terminal 130 is conductive, the printed circuit board (the connected member 120) is electrically connected to the terminal 130 by the connecting portion, and the terminal 130 is electrically connected to the electronic component 110. Therefore, the electronic component 110 is electrically connected to the printed circuit board (the connected member 120).

Because the nut 150 is restricted in the notch 148 by the terminal 130, the screw 155 as well as the connected member 120 is restricted by the terminal 130 after the nut is coupled with the screw 155. And because the degrees of freedom in the first direction D1, the second direction D2, and the third direction D3 of the terminal 130 is restricted, and the terminal 130 is stably fixed to the fixing member 140 (the housing). Therefore, in the embodiment, the connected member 120 is stably fixed to the fixing member 140 (the housing).

In order to easily couple or detach the coupling portion 134 with the coupling portion 144 and to easily couple or detach the coupling portion 136 with the coupling portion 146, in the embodiment, the body of the fixing member 140 (the housing) has a recessed portion 149, for providing an assembling space. The second surface 142S of the body 142 of the fixing member 140 (the housing) is at least one inner surface of the recessed portion.

Figure 4:
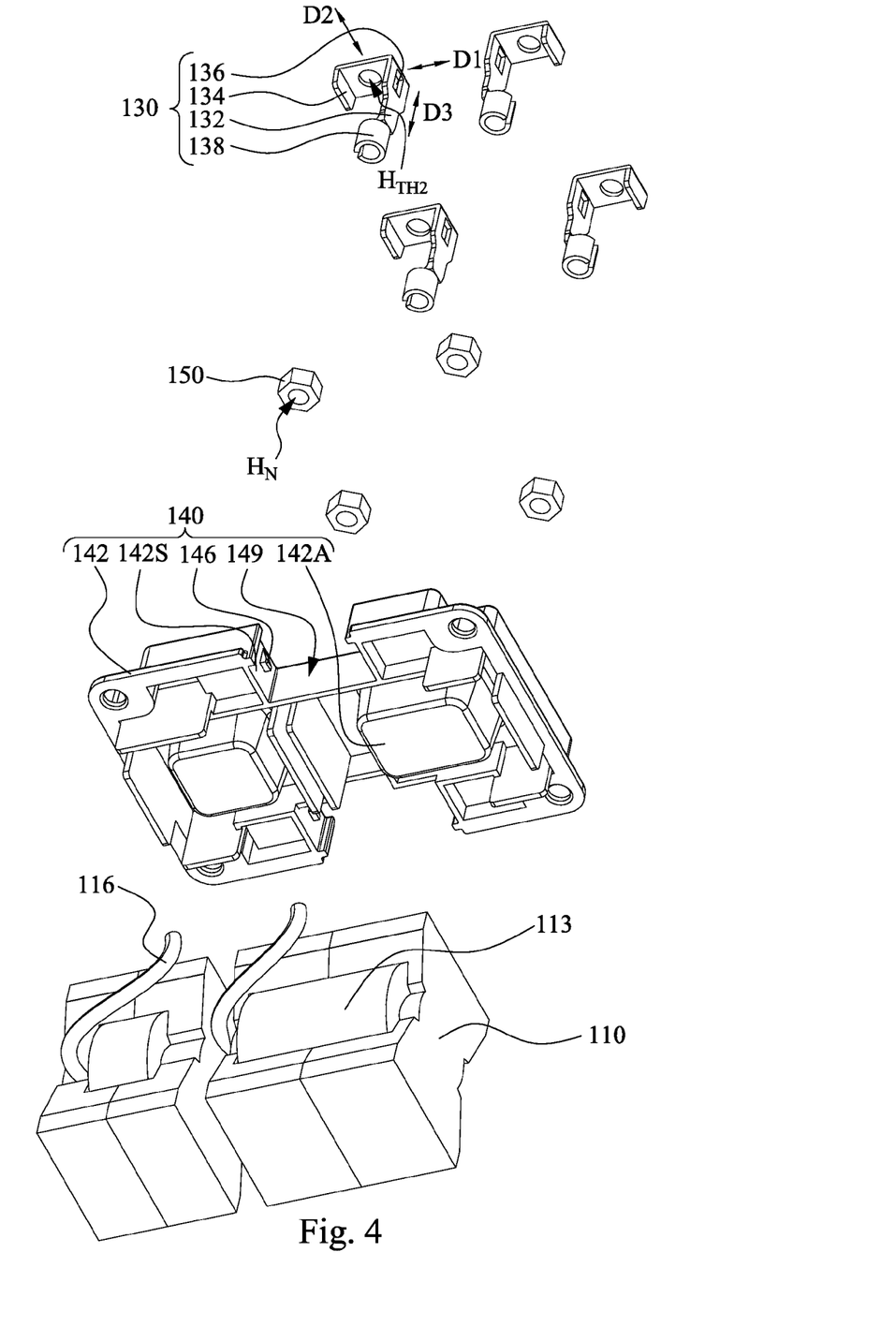
FIG. 4 is a perspective view of an assembling surface of the fixing member of FIG. 2.

FIG. 4 is a perspective view of an assembling surface 142A of the fixing member 140 of FIG. 2. As shown in FIG. 3 and FIG. 4, in the embodiment, the body of the fixing member 140 (the housing) has an assembling surface 142A facing the electronic component 110, and the first surface 142F is opposite to the assembling surface 142A. Specifically, the first surface 142F is a top surface opposite to the assembling surface 142A. The fixing member 140 may be assembled to the electronic component 110 by gluing, coupling, or other appropriate methods.

Figure 5:
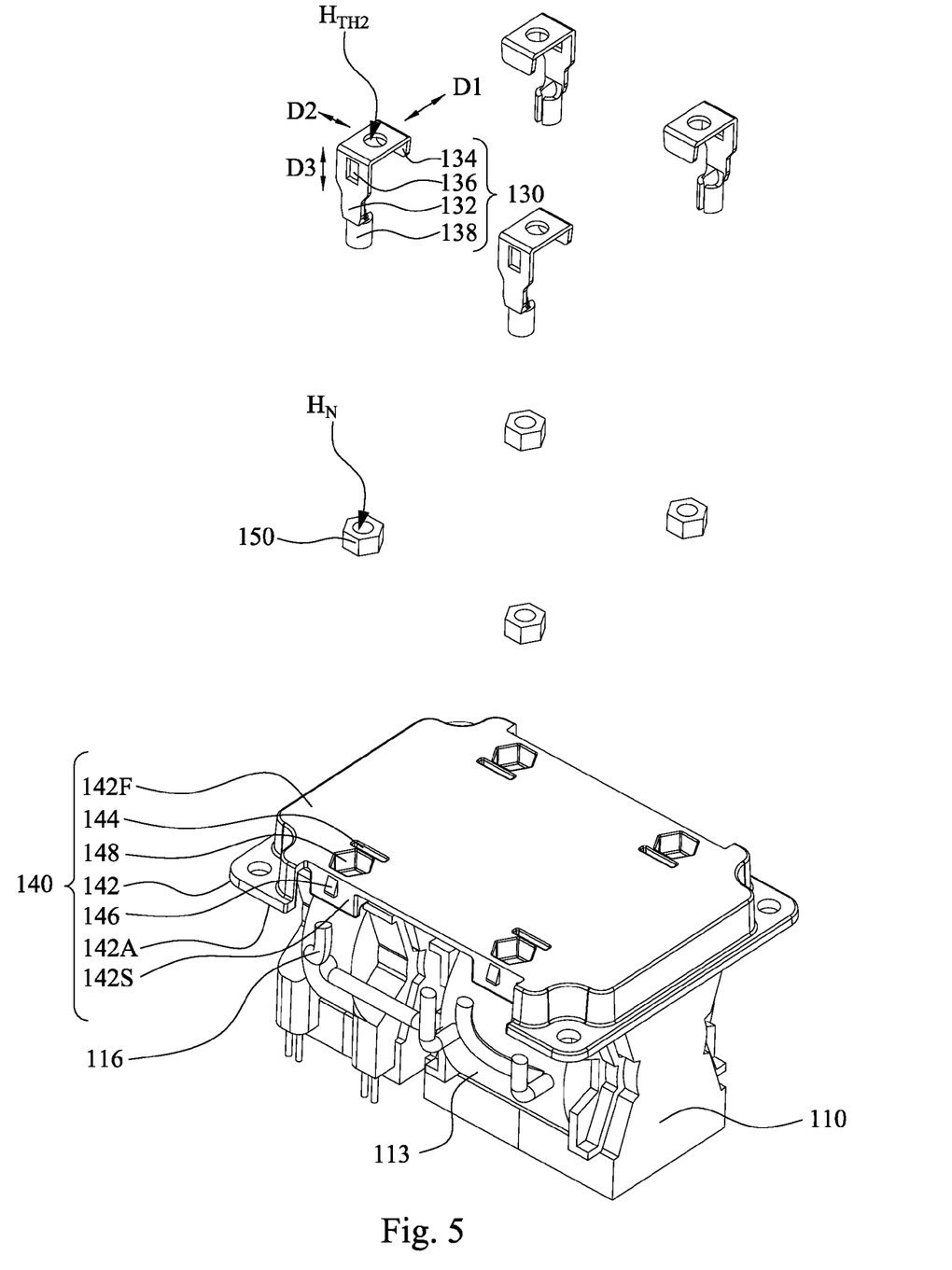
FIG. 5 is an exploded view of the fixing member and the terminal according to another embodiment of this invention.

Though in FIG. 3, the second surface 142S is at least one inner surface of the recessed portion 149, people having ordinary skill in the art can make proper modification according to their actual needs. FIG. 5 is an exploded view of the fixing member 140 and the terminal 130 according to another embodiment of this invention. In another embodiment shown in FIG. 5, the second surface 142S is a side surface connected to the first surface 142F. The key point is that the terminal 130 can be coupled with the fixing member 140.

In the embodiment, the electronic component 110 includes at least one electromagnetic inductive device 113 such as an inductor or a transformer. People having ordinary skill in the art can make proper modification to the electronic component 110 according to their actual needs.

Figure 6:
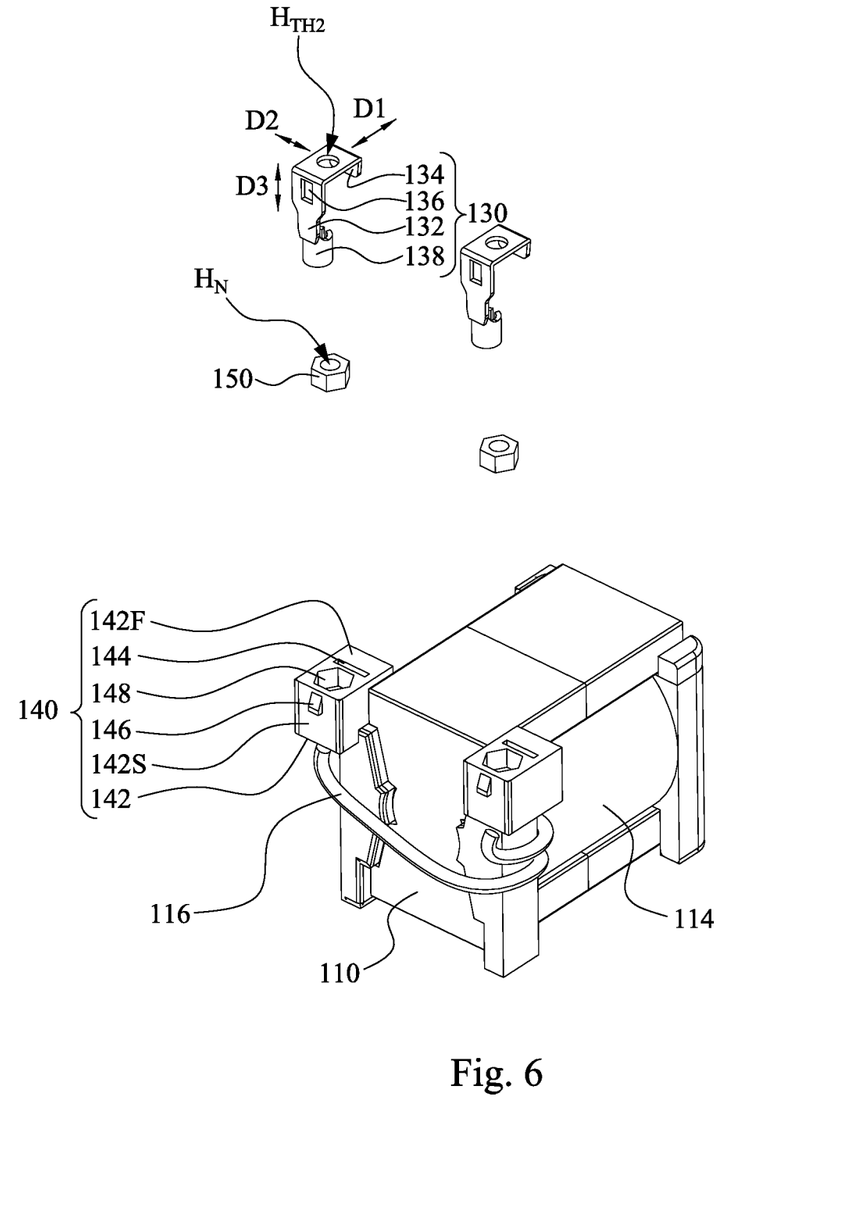
FIG. 6 is an exploded view of the fixing member and the terminal according to another embodiment of this invention.

In another embodiment, the fixing member 140 is a bobbin, and at least one coil 114 is wound around the bobbin which is known by people having ordinary skill in the art. FIG. 6 is an exploded view of the fixing member 140 and the terminal 130 according to another embodiment of this invention. As shown in FIG. 6, the fixing member 140 (the bobbin) includes a body 142, the coupling portion 144, and the coupling portion 146. The body 142 of the fixing member 140 (the bobbin) has a first surface 142F and a second surface 142S connected to the first surface 142F, and a normal direction of the first surface 142F and a normal direction of the second surface 142S are interlaced with each other. The coupling portion 144 is disposed on the first surface 142F, for being detachably coupling with the coupling portion 134 of the terminal 130, such that the degrees of freedom in the first direction D1 and the second direction D2 of the terminal 130 are restricted. The coupling portion 146 is disposed on the second surface 142S, for being detachably coupling with the coupling portion 136 of the terminal 130, such that the degree of freedom in the third direction D3 of the terminal 130 is restricted. The first direction D1, the second direction D2, and the third direction D3 are linearly independent. The terminal 130 includes a connecting end 138, a connecting wire 116 extends from the coil 114, and the connecting end 138 is electrically connected to the connecting wire 116, such that the coil 114 is electrically connected to the terminal 130. As shown in FIG. 6, in the embodiment, two terminals 130 are coupled with the body 142 of the fixing member 140 (the bobbin).

Similarly, in the embodiment, the body 142 of the fixing member 140 (the bobbin) has a notch 148 therein, for accommodating the nut 150. When the nut 150 is accommodated in the notch 148, the coupling portion 134 is coupled with the coupling portion 144, and the coupling portion 136 is coupled with the coupling portion 146, the tapped hole $H_N$ of the nut 150 is connected to the through hole $H_{TH2}$ of the body 132 of the terminal 130.

Figure 7:
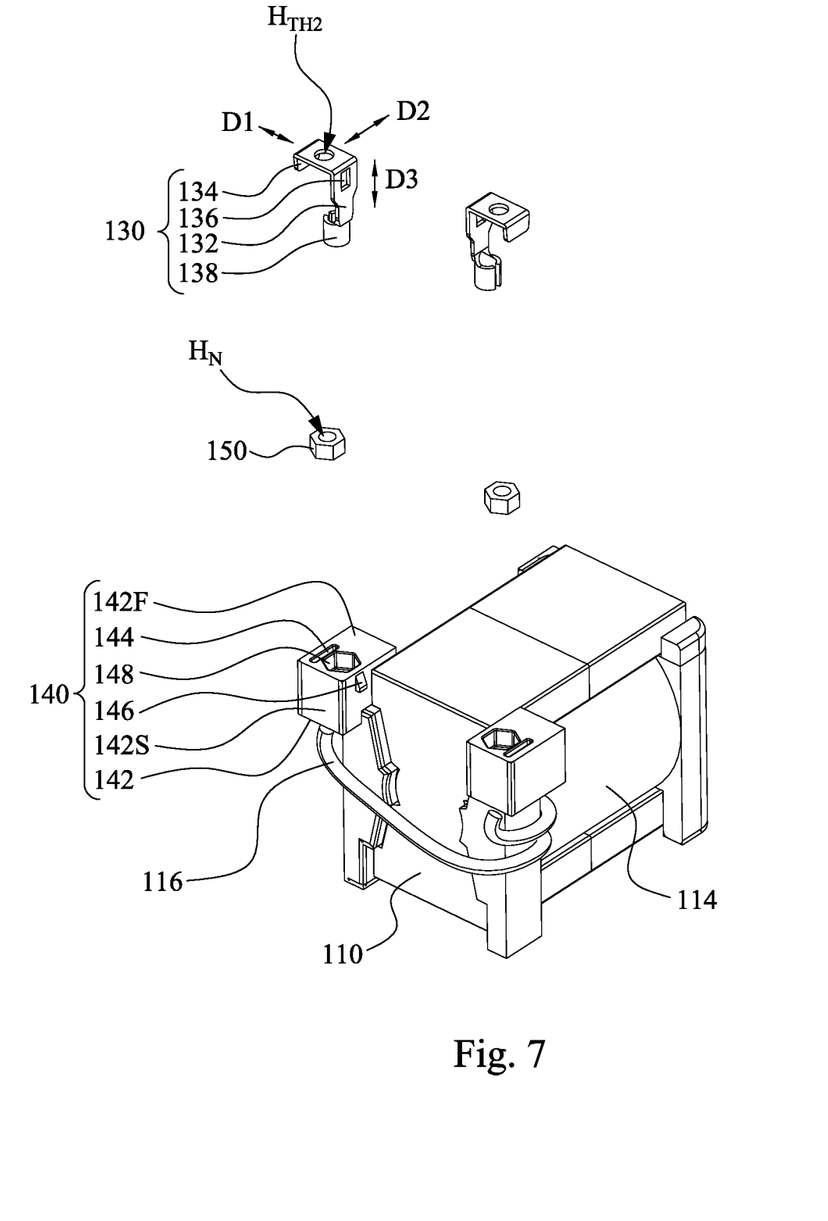
FIG. 7 is an exploded view of the fixing member and the terminal according to another embodiment of this invention.
Figure 8:
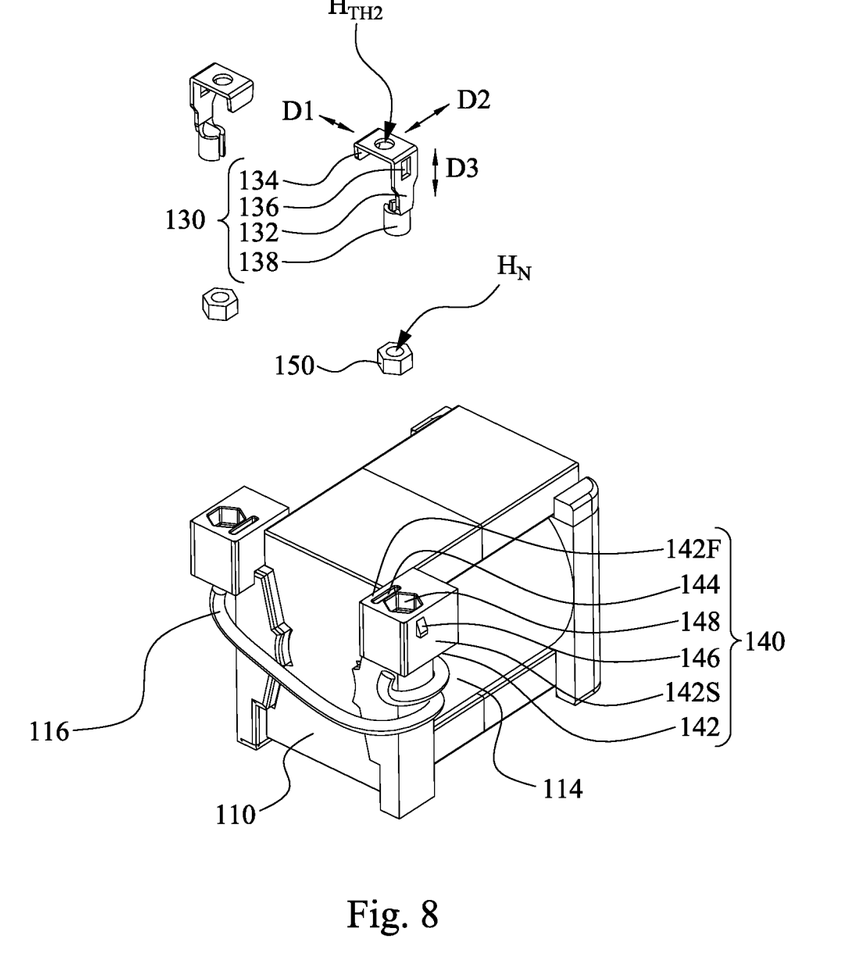
FIG. 8 is an exploded view of the fixing member and the terminal according to another embodiment of this invention.

Though the second surface 142S is a specific side surface connected to the first surface 142F in FIG. 6, people having ordinary skill in the art can make proper modification according to their actual needs. FIG. 7 is an exploded view of the fixing member 140 and the terminal 130 according to another embodiment of this invention. FIG. 8 is an exploded view of the fixing member 140 and the terminal 130 according to another embodiment of this invention. As shown in FIG. 7 and FIG. 8, the second surface 142S is another side surface connected to the first surface 142F. The key point is that the terminal 130 can be coupled with the fixing member 140.

As shown in FIG. 2, FIGS. 6 to 8, in the embodiment, the electronic component 110 includes at least one coil 114, and the coil 114 is disposed in the fixing member 140 (the bobbin).

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A housing for at least partially covering an electronic component, the housing comprising:
    a body having a first surface and a second surface connected to the first surface, wherein a normal direction of the first surface and a normal direction of the second surface are interlaced with each other, the body having a notch therein;
    at least one first coupling portion disposed on the first surface, configured for being detachably coupled with at least one second coupling portion of at least one terminal of the electronic component, such that degrees of freedom in a first direction and a second direction of the terminal are restricted; and at least one third coupling portion disposed on the second surface, configured for being detachably coupled with at least one fourth coupling portion of the terminal, such that a degree of freedom in a third direction of the terminal is restricted, wherein the first direction, the second direction, and the third direction are linearly independent;

a connected member having a through hole therein;

a nut accommodated in the notch, wherein the nut has a tapped hole therein; and a screw passing the through hole of the connected member and a through hole of the terminal and coupled with the nut.

2. The housing of claim 1, wherein the first coupling portion is a protruded coupling portion or a recessed coupling portion.

3. The housing of claim 1, wherein the third coupling portion is a protruded coupling portion or a recessed coupling portion.

4. The housing of claim 1, wherein the body has an assembling surface facing the electronic component and a recessed portion, the first surface is opposite to the assembling surface, and the second surface is at least one inner surface of the recessed portion.

5. The housing of claim 1, wherein the body has an assembling surface facing the electronic component, the first surface is opposite to the assembling surface, and the second surface is a side surface connected to the first surface.

6. The housing of claim 1, wherein a connecting wire of the electronic component is electrically connected to a connecting end of the terminal.

7. A bobbin for holding at least one coil, comprising:

a body having a first surface and a second surface connected to the first surface, wherein a normal direction of the first surface and a normal direction of the second surface are interlaced with each other, the body having a notch therein;

at least one first coupling portion disposed on the first surface, configured for being detachably coupled with at least one second coupling portion of at least one terminal electrically connected to the coil, such that degrees of freedom in a first direction and a second direction of the terminal are restricted; and at least one third coupling portion disposed on the second surface, configured for detachably being coupled with at least one fourth coupling portion of the terminal, such that a degree of freedom in a third direction of the terminal is restricted, wherein the first direction, the second direction, and the third direction are linearly independent;

a connected member having a through hole therein;

a nut accommodated in the notch, wherein the nut has a tapped hole therein; and a screw passing the through hole of the connected member and a through hole of the terminal and coupled with the nut.

8. The bobbin of claim 7, wherein the first coupling portion is a protruded coupling portion or a recessed coupling portion.

9. The bobbin of claim 7, wherein the third coupling portion is a protruded coupling portion or a recessed coupling portion.

10. The bobbin of claim 7, wherein the coil is electrically connected to a connecting end of the terminal.

11. An electronic device, comprising:

at least one electronic component;

a connected member having a through hole therein;

at least one terminal electrically connected to the electronic component and the connected member, the terminal comprising:

a body having a through hole therein;

at least one first coupling portion disposed on the body of the terminal; and at least one second coupling portion disposed on the body of the terminal;

at least one fixing member connected to the electronic component, the fixing member comprising:

a body having a first surface and a second surface connected to the first surface, wherein a normal direction of the first surface and a normal direction of the second surface are interlaced with each other, the body of the fixing member having a notch therein;

at least one third coupling portion disposed on the first surface, configured for being detachably coupled with the first coupling portion, such that degrees of freedom in a first direction and a second direction of the terminal are restricted; and at least one fourth coupling portion disposed on the second surface, configured for being detachably coupled with the second coupling portion, such that a degree of freedom in a third direction of the terminal is restricted, wherein the first direction, the second direction, and the third direction are linearly independent;

a nut accommodated in the notch, wherein the nut has a tapped hole therein; and a screw passing the through hole of the connected member and the through hole of the body of the terminal and coupled with the nut.

12. The electronic device of claim 11, wherein the first coupling portion is a protruded coupling portion, and the third coupling portion is a recessed coupling portion; or the first coupling portion is a recessed coupling portion, and the third coupling portion is a protruded coupling portion.

13. The electronic device of claim 11, wherein the second coupling portion is a recessed coupling portion, and the fourth coupling portion is a protruded coupling portion; or the second coupling portion is a protruded coupling portion, and the fourth coupling portion is a recessed coupling portion.

14. The electronic device of claim 11, wherein the terminal comprises a connecting end, the electronic component comprises a connecting wire, and the connecting end is electrically connected to the connecting wire.

15. The electronic device of claim 11, wherein the fixing member is a housing, and the housing at least partially covers the electronic component.

16. The electronic device of claim 15, wherein the body of the fixing member has an assembling surface facing the electronic component and a recessed portion, the first surface is opposite to the assembling surface, and the second surface is at least one inner surface of the recessed portion.

17. The electronic device of claim 15, wherein the body of the fixing member has an assembling surface facing the electronic component, the first surface is opposite to the assembling surface, and the second surface is a side surface connected to the first surface.

18. The electronic device of claim 11, wherein the electronic component comprises at least one electromagnetic induction module.

19. The electronic device of claim 11, wherein the fixing member is a bobbin.

20. The electronic device of claim 19, wherein the electronic component comprises at least one coil, and the coil is disposed on the bobbin.

21. The electronic device of claim 20, wherein the terminal comprises a connecting end that is electrically connected to the coil.

* * * * *